(12) United States Patent
Goergen

(10) Patent No.: US 7,336,502 B1
(45) Date of Patent: Feb. 26, 2008

(54) HIGH-SPEED ROUTER WITH BACKPLANE USING TUNED-IMPEDANCE THRU-HOLES AND VIAS

(75) Inventor: Joel R. Goergen, Maple Grove, MN (US)

(73) Assignee: Force10 Networks, Inc., San Jose, CA (US)

( * ) Notice: Subject to any disclaimer, the term of this patent is extended or adjusted under 35 U.S.C. 154(b) by 411 days.

(21) Appl. No.: 10/454,735

(22) Filed: Jun. 3, 2003

(51) Int. Cl.
*H01R 12/16* (2006.01)
(52) U.S. Cl. ...................................... 361/788; 361/780
(58) Field of Classification Search ................ 174/255, 174/256, 257, 260–262, 265; 361/788, 780, 361/794, 777; 439/66
See application file for complete search history.

(56) References Cited

U.S. PATENT DOCUMENTS

| | | | |
|---|---|---|---|
| 4,494,083 A * | 1/1985 | Josefsson et al. ............. 333/33 |
| 4,694,123 A | 9/1987 | Massey |
| 4,862,161 A | 8/1989 | Schomers |
| 4,891,616 A | 1/1990 | Renken et al. |
| 5,010,641 A | 4/1991 | Sisler |
| 5,261,153 A | 11/1993 | Lucas |
| 5,308,926 A | 5/1994 | Auerbuch et al. |
| 5,311,406 A | 5/1994 | Snodgrass |
| 5,397,861 A | 3/1995 | Urquhart |
| 5,548,734 A | 8/1996 | Kolinski |
| 5,566,083 A | 10/1996 | Fang |
| 5,682,298 A | 10/1997 | Raynham |
| 5,691,209 A | 11/1997 | Liberkowski |
| 5,841,074 A | 11/1998 | Egan |
| 5,870,274 A | 2/1999 | Lucas |
| 6,015,300 A | 1/2000 | Schmidt et al. |
| 6,030,693 A | 2/2000 | Boyko |
| 6,081,430 A | 6/2000 | LaRue |
| 6,091,609 A | 7/2000 | Hutson et al. |
| 6,181,004 B1 | 1/2001 | Koontz et al. |

(Continued)

FOREIGN PATENT DOCUMENTS

EP   0594200 A2   4/1994

(Continued)

OTHER PUBLICATIONS

Teradyne: VHDM Home Page; *VHDM High-Speed Differential* printed on Nov. 6, 2000 from website located at www.teradyne.com/prods/bps/vhdm/intro.html; pp. 1-3.

(Continued)

*Primary Examiner*—Tuan T. Dinh
*Assistant Examiner*—Yuriy Semenenko
(74) *Attorney, Agent, or Firm*—James E Harris

(57) ABSTRACT

A high-speed router backplane is disclosed. The router backplane uses differential signal pairs on multiple signal layers, each sandwiched between a pair of digital ground layers. To reduce routing complexity, at least some of the differential signal pairs route through a via pair, somewhere along their path, to a different signal layer. Specific via designs reduce differential signal distortion due to the via pair, allowing the backplane to operate reliably at differential signal rates in excess of 3 Gigabits per second. In particular, each via passes through nonfunctional conductive pads on selected digital ground plane layers, the pads separated from the remainder of its ground plane layer by a clearance, thereby modifying the impedance of the via and reducing reflections from the stubs created by the via.

14 Claims, 8 Drawing Sheets

U.S. PATENT DOCUMENTS

| | | | | |
|---|---|---|---|---|
| 6,229,095 | B1 | 5/2001 | Kobayashi | |
| 6,333,981 | B1 | 12/2001 | Weir et al. | |
| 6,388,208 | B1* | 5/2002 | Kiani et al. | 174/266 |
| 6,392,164 | B1* | 5/2002 | Iwaki et al. | 174/262 |
| 6,528,737 | B1* | 3/2003 | Kwong et al. | 174/262 |
| 6,534,872 | B1* | 3/2003 | Freda et al. | 257/774 |
| 6,545,876 | B1* | 4/2003 | Kwong et al. | 361/780 |
| 6,586,682 | B2* | 7/2003 | Strandberg | 174/255 |
| 6,594,153 | B1* | 7/2003 | Zu et al. | 361/792 |
| 6,630,627 | B1 | 10/2003 | Tobita | |
| 6,751,699 | B1 | 6/2004 | Langley, Sr. et al. | |
| 6,767,616 | B2* | 7/2004 | Ooi et al. | 428/209 |
| 7,045,719 | B1* | 5/2006 | Alexander et al. | 174/262 |
| 2002/0060366 | A1 | 5/2002 | Kikuchi et al. | |
| 2004/0184249 | A1* | 9/2004 | Aguinaga et al. | 361/788 |

FOREIGN PATENT DOCUMENTS

| | | |
|---|---|---|
| EP | 11437671 A2 | 10/2001 |
| JP | 2001102755 | 4/2001 |
| WO | 00 78105 | 12/2000 |

OTHER PUBLICATIONS

Teradyne: Virtual Exhibits; *Total Interconnect Solutions* printed on Nov. 6, 2000 from website located at www.iec.org/exhibits/teradyne_02/; pp. 1-5.

Cahners EDN Access; *New printed-wiring-board materials guard against garbled gigabits* printed on Nov. 6, 2000 from website located at www.ednmag.com/ednmag/reg/1999/111199/23ms593.htm; pp. 1-5.

PARKnelco; *N4000-6 Overview* and product description; pp. 1-2.

PARKnelco; *N6000 and N6000SI Overview* and product description; pp. 1-2.

PARKnelco; *N7000-2 HT Laminate and N7000-3 Prepeg Overview* and product description; pp. 1-2.

PARKnelco; *N8000 Overview* and product description; pp. 1-2.

Markstein, H.W.: *Ensuring Signal Integrity in Connectors, Cables, and Backplanes*, Electronic Packaging and Production; vol. 36, No. 11; Oct. 1, 1996, pp. 61-69.

Scaminaci, J: *Avoiding Signal Integrity Problems in Backplanes*, Electronic Packaging and Production; vol. 34, No. 7; Jul. 1, 1994, pp. 40-44.

Markstein, H.W.: *Impedances Dictate Backplanes*, Electronic Design, Packaging and Production; vol. 33, No. 12; Dec. 1, 1993, pp. 38-40.

Markstein, H.W.: *Packaging for High-Speed Logic* Electronic Packaging and Production, No. 9, Sep. 27, 1987, pp. 48-50.

Teradyne: Web Proforum Tutorial; *Design Considerations for Gigabit Backplane Systems Tutorial* printed on Nov. 6, 2000 from website located at www.iec.org/tutorials/design_backplane/; pp. 1-43.

Teradyne: VHDM Home Page; *Backplane Assemblies and Connectors* printed on Nov. 6, 2000 from website located at www.teradyne.com/prods/bps/vhdm/intro.html; pp. 1-3.

Teradyne: Products; *Backplanes* printed on Nov. 6, 2000 from website located at www.teradyne.com/prods/bps/vhdm/intro.html; pp. 1-2.

Johnson and Graham; "*High-Speed Digital Design, A Handbook of Black Magic*"; 1993; pp. 257-262.

* cited by examiner

| Conductive Layers | | | | Insulating Layers | |
|---|---|---|---|---|---|
| Layer No. | Thickness | Type | | Type | Thickness |
| L01 { | 2.0 | Foil/Plating | | Mask | 0.7 |
|  | 1.2 | Pads | | B-stage | 5.4 |
| L02 | 1.4 | GND | | Core | 7.5 |
| L03 | 1.4 | HS1 | | B-stage | 6.5 |
| L04 | 1.4 | GND | | Core | 7.5 |
| L05 | 1.4 | HS2 | | B-stage | 6.5 |
| L06 | 1.4 | GND | | Core | 7.5 |
| L07 | 1.4 | HS3 | | B-stage | 6.5 |
| L08 | 1.4 | GND | | Core | 7.5 |
| L09 | 1.4 | HS4 | | B-stage | 6.5 |
| L10 | 1.4 | GND | | Core | 7.5 |
| L11 | 1.4 | HS5 | | B-stage | 6.5 |
| L12 | 1.4 | GND | | Core | 7.5 |
| L13 | 1.4 | Signal x1 | | B-stage | 4.0 |
| L14 | 1.4 | Signal y1 | | Core | 7.5 |
| L15 | 1.4 | GND | | Lam 2 B-stg | 9.0 |
|  |  |  |  | Lam 1 B-stg | 8.5 |
| L16 | 5.6 | A 48V rtn | | Core | 6.0 |
| L17 | 5.6 | A 48V dc | | Lam 1 B-stg | 8.5 |
|  |  |  |  | Lam 2 B-stg | 12.0 |
|  |  |  |  | Lam 1 B-stg | 8.5 |
| L18 | 5.6 | B 48V dc | | Core | 6.0 |
| L19 | 5.6 | B 48V rtn | | Lam 1 B-stg | 8.5 |
|  |  |  |  | Lam 2 B-stg | 9.0 |
| L20 | 1.4 | GND | | Core | 7.5 |
| L21 | 1.4 | Signal y2 | | B-stage | 4.0 |
| L22 | 1.4 | Signal x2 | | Core | 7.5 |
| L23 | 1.4 | GND | | B-stage | 6.9 |
| L24 | 1.4 | HS6 | | Core | 7.5 |
| L25 | 1.4 | GND | | B-stage | 6.9 |
| L26 | 1.4 | HS7 | | Core | 7.5 |
| L27 | 1.4 | GND | | B-stage | 6.9 |
| L28 | 1.4 | HS8 | | Core | 7.5 |
| L29 | 1.4 | GND | | B-stage | 6.9 |
| L30 | 1.4 | HS9 | | Core | 7.5 |
| L31 | 1.4 | GND | | B-stage | 6.9 |
| L32 | 1.4 | HS10 | | Core | 7.5 |
| L33 | 1.4 | GND | | B-stage | 5.4 |
| L34 { | 1.2 | Pads | | Mask | 0.7 |
|  | 2.0 | Foil/Plating | |  |  |

Fig. 4

| Conductive Layers | | | | Insulating Layers | |
|---|---|---|---|---|---|
| Layer No. | Thickness | Type | | Type | Thickness |
| L01 { | 2.0 | Foil/Plating | | Mask | 0.7 |
|  | 1.2 | Pads | | B-stage | 5.7 |
| L02 | 1.4 | GND | | Core | 7.0 |
| L03 | 1.4 | HS1 | | B-stage | 7.9 |
| L04 | 1.4 | GND | | Core | 7.0 |
| L05 | 1.4 | HS2 | | B-stage | 7.9 |
| L06 | 2.8 | GND | | Core | 7.0 |
| L07 | 2.8 | A 48V rtn | | B-stage | 6.0 |
| L08 | 2.8 | A 48V dc | | Core | 7.0 |
| L09 | 2.8 | B 48V dc | | B-stage | 6.0 |
| L10 | 2.8 | B 48V rtn | | Core | 7.0 |
| L11 | 2.8 | GND | | B-stage | 7.9 |
| L12 | 1.4 | HS3 | | Core | 7.0 |
| L13 | 1.4 | GND | | B-stage | 7.9 |
| L14 | 1.4 | HS4 | | Core | 7.0 |
| L15 | 1.4 | GND | | B-stage | 5.7 |
| L16 { | 1.2 | Pads | | Mask | 0.7 |
|  | 2.0 | Foil/Plating | | | |

Fig. 7

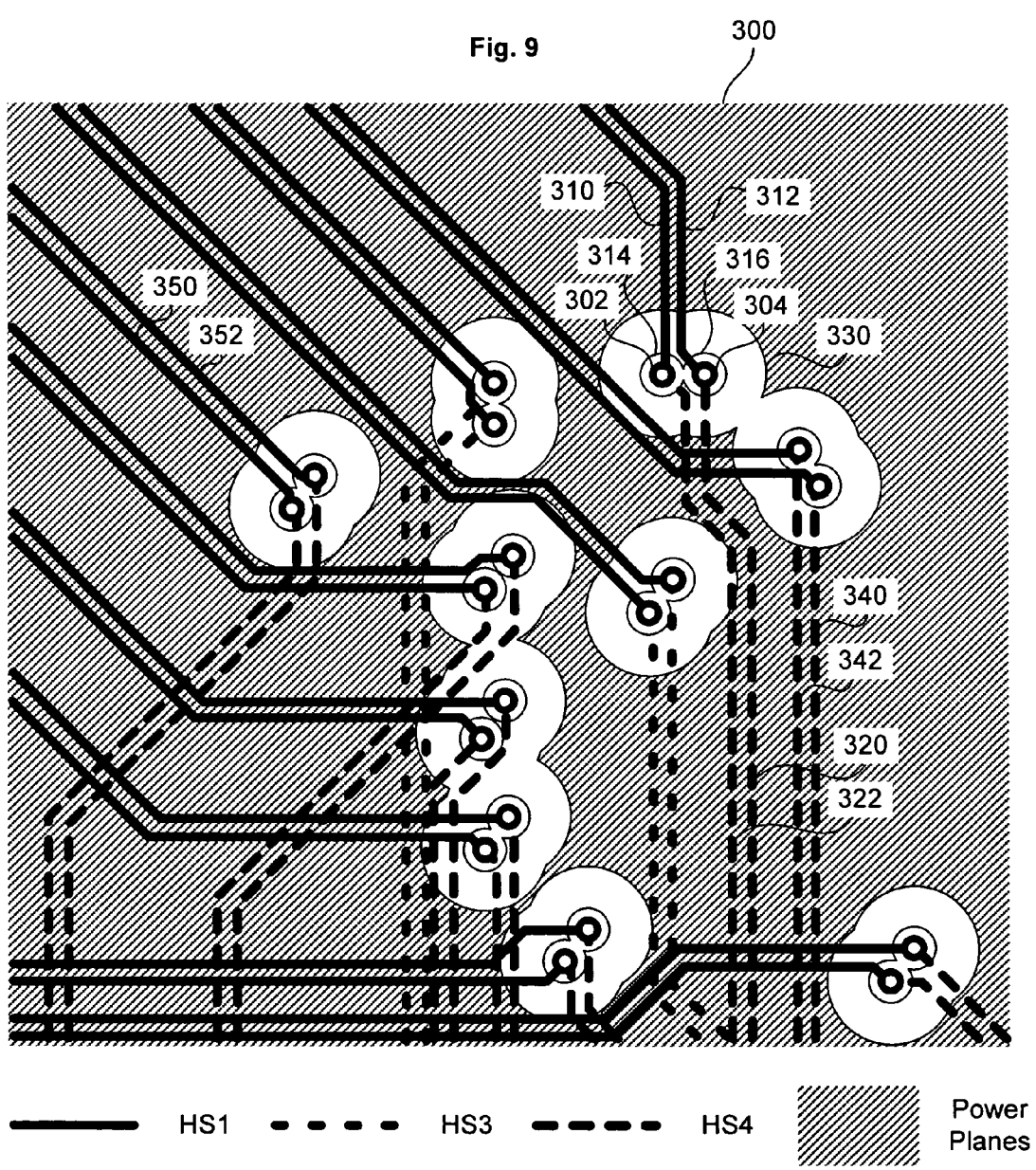

US 7,336,502 B1

HIGH-SPEED ROUTER WITH BACKPLANE USING TUNED-IMPEDANCE THRU-HOLES AND VIAS

FIELD OF THE INVENTION

This invention relates generally to backplanes, and more specifically to backplane wiring systems for highly interconnected, high-speed modular digital communications systems such as routers and switches.

BACKGROUND OF THE INVENTION

A backplane generally comprises a printed circuit board having a number of card connection slots or bays. Each slot or bay comprises, e.g., one or more modular signal connectors or card edge connectors, mounted on the backplane. A removable circuit board or "card" can be plugged into the connector(s) of each slot. Each removable circuit board contains drivers and receivers necessary for communication of signals across the backplane with corresponding drivers and receivers on other removable circuit boards.

One or more layers of conductive traces are formed on and/or in the backplane. The traces connect to individual signal connection points at the various slots to form data lines and control lines.

In U.S. patent application Ser. No. 10/068,622 (the '622 application), entitled "Passive Transmission Line Equalization Using Circuit Board Through-Holes", filed Feb. 5, 2002, and incorporated herein by reference, the inventor of the present application describes a high-speed router backplane design. This design is applicable to extremely high signaling speeds (it has been tested up to 10 Gbps (Gigabit-per-second) signaling rates), large panel sizes, and high overall throughputs. Many of the features of the embodiments described herein have been incorporated from this prior disclosure.

SUMMARY OF THE INVENTION

The preferred embodiments described in the '622 application incorporate a number of unconventional design features, such as a high layer count (and large overall thickness), thick power planes, and an exotic dielectric material. While these backplanes are capable of throughputs measurable in Terabits/second and high-wattage, low-noise power distribution, the features used to obtain this extreme performance tend to drive up cost.

In some applications, the router described in the prior application uses only a fraction of the available backplane card slots and massive bandwidth. It has now been recognized that a need exists for a smaller, simpler, and more economic backplane that retains most of the desirable qualities of the full-feature backplane. Consequently, some of the embodiments described herein seek to support the same line, switch fabric, and RPM card types as described for the full-feature backplane, but in a backplane (and router) form factor with significantly decreased complexity.

In one embodiment, the maximum number of line cards supported has been reduced from fourteen to seven, and the maximum signaling speed has been reduced to 3.125 Gbps. This allows for a different layout with shorter longest-trace lengths, smaller differential pairs, thinner power planes, and a much thinner board with significantly fewer signal layers (four vs. fourteen layers for the larger board). It has also been discovered that, at least for 3.125 Gbps operation, this embodiment can be fabricated entirely using FR4 insulating material instead of more exotic materials such as N6000.

Even with the reduction in trace count due to supporting half as many line cards, this embodiment would be considerably thicker were it not for one other significant difference from the prior design—it incorporates layer-swapping vias. It has been found that the additional signal degradation created by passing signals thru vias can be largely compensated for by the use of nonfunctional pads to alter the impedance of the vias.

BRIEF DESCRIPTION OF THE DRAWING

The invention may be best understood by reading the disclosure with reference to the drawing, wherein:

FIG. 4 shows the complete material stack in cross-section for the router backplane shown in FIG. 3;

FIG. 7 shows the complete material stack in cross-section for the embodiment shown in FIG. 6;

FIG. 9 shows an exemplary cluster of layer-swapped differential pairs superimposed on one power plane layer.

DETAILED DESCRIPTION OF THE PREFERRED EMBODIMENTS

Several terms have been assigned particular meanings within the context of this disclosure. As used herein, high speed signaling refers to signaling on a differential signal pair at a data rate greater than about 2.5 Gbps. A high-speed signaling layer or high-speed differential trace plane contains high-speed differential signal trace pairs, but may also contain lower speed and/or single-ended traces. A core dielectric layer is one that is cured and plated prior to assembly of a circuit board. A b-stage dielectric layer is one that is cured during assembly of cores into the circuit board. Differential signaling (or balanced signaling) is a mode of signal transmission, using two conductors, in which each conductor carries a signal of equal magnitude, but, opposite polarity. Single-ended signaling (or unbalanced signaling) is a mode of signal transmission where one conductor carries a signal with respect to a common ground. The impedance of a differential trace is more differential than single-ended if the impedance between that trace and its differentially paired trace is less than the impedance between that trace and ground. A through-hole or thru-hole electrically couples a conductor exterior to a circuit board to one or more internal circuit board layers, while a via transfers signals from one internal circuit board layer to one or more other internal circuit board layers.

Overall Router Overview

Figure 1:
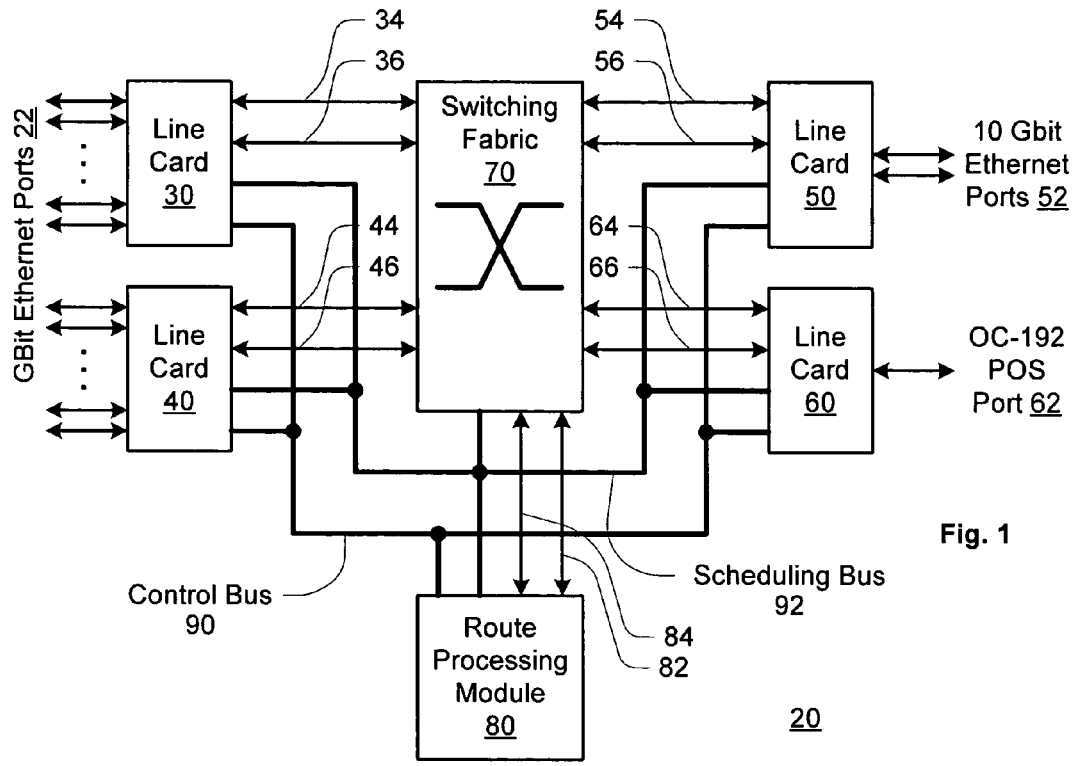
FIG. 1 contains a block diagram of a high-speed router.

An appreciation for the present invention can be gained by first understanding the backplane, router, and backplane fabrication embodiments as disclosed in the '622 application. The router embodiments disclosed in the '622 application, like those disclosed in the present application, use an overall router architecture as illustrated in FIG. 1. FIG. 1 shows a high-level block diagram for a router 20. Line cards 30, 40, 50, and 60 provide physical ports to the device. For instance, line cards 30 and 40 can each provide up to 24 Gigabit Ethernet ports 22 into router 20. Line card 50 provides two 10-Gigabit Ethernet ports 52, and line card 60 provides an OC-192 POS (Packet-Over-Sonet) port 62. Although four line cards are shown, many backplanes provide slots to accommodate many more cards, e.g., up to fourteen line cards in one '622 application embodiment (illustrated in FIG. 3) and up to seven line cards in one embodiment described for the present invention. The user can configure device 20 to accommodate different traffic capacities, traffic models, and physical port mixes by the appropriate selection of numbers and types of line cards.

Switching fabric 70 switches each routed data packet from that packet's ingress port/line card to that packet's egress port/line card. Switching fabric 70 connects to each line card through two full duplex switching fabric port connections (see, e.g., port connections 44, 46 to line card 40). Switching fabric 70 can be reconfigured rapidly on an epoch-by-epoch basis (an epoch is a defined time slice). For instance, at one epoch, fabric 70 may be switching packets from ingress port 44 to egress port 54 and from ingress port 46 to egress port 66, and at the next epoch, fabric 70 could be switching packets from ingress port 44 to egress port 64. At any given epoch, ingress ports and egress ports are paired to utilize as many switching ports as possible without unduly delaying a particular set of packets.

Figure 3:
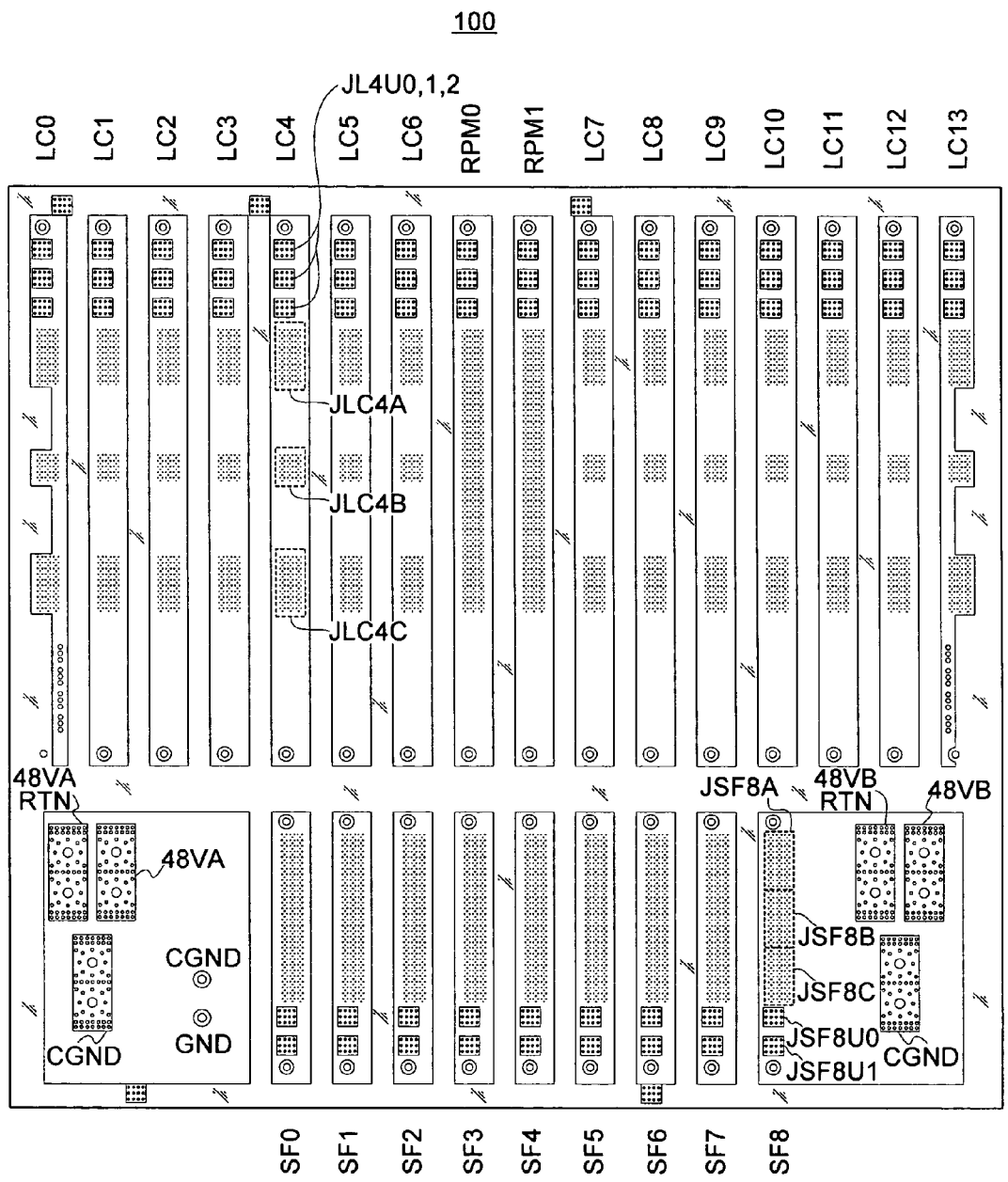
FIG. 3 shows the external layout for a router backplane circuit board according to an embodiment described in the '622 application.

In the backplane layout of FIG. 3, the switching fabric functionality is distributed among nine identical switch fabric cards that connect to slots SF0 to SF8. Eight switch fabric cards are ganged to actively switch packet data in parallel (the ninth provides redundancy). In this configuration, a full-duplex switching fabric "port" actually comprises 18 differential pairs connected to a line card—one transmit pair from the line card to each switch fabric card, and one receive pair from each switch fabric card to the line card.

Route processing module (RPM) 80 resides on an RPM card. RPM 80 has several duties. RPM 80 is responsible for overall system operation, i.e., recognizing and booting new line cards, identifying faulty line cards, packet route discovery, and sharing routing table information with the line cards. RPM 80 also provides a user interface (not shown) to allow a system operator to configure the system and view system parameters. For each of these functions, RPM 80 generally communicates with the line cards over control bus 90. As compared to the switching fabric ports, the control bus can be a relatively low-speed channel.

Another duty of RPM 80 is scheduling switching fabric 70. In a preferred implementation, RPM 80 reconfigures switching fabric 70 every epoch. RPM 80 uses scheduling bus 92 to communicate to switching fabric 70—as well as to line cards 30, 40, 50, 60—the switching fabric configuration for the upcoming epochs. RPM 80 attempts to schedule as many fabric ports as possible during each epoch, and to ensure that data is handled promptly and fairly. As compared to the switching fabric ports, the scheduling bus can be a relatively low-speed channel.

RPM 80 also maintains its own switching fabric port connection 82, allowing it to receive and transmit packets external to the router using any of the line card physical ports. In the backplane design of FIG. 3, provision is also made for a second RPM card connected to router 20 to provide failover capability.

Figure 2:
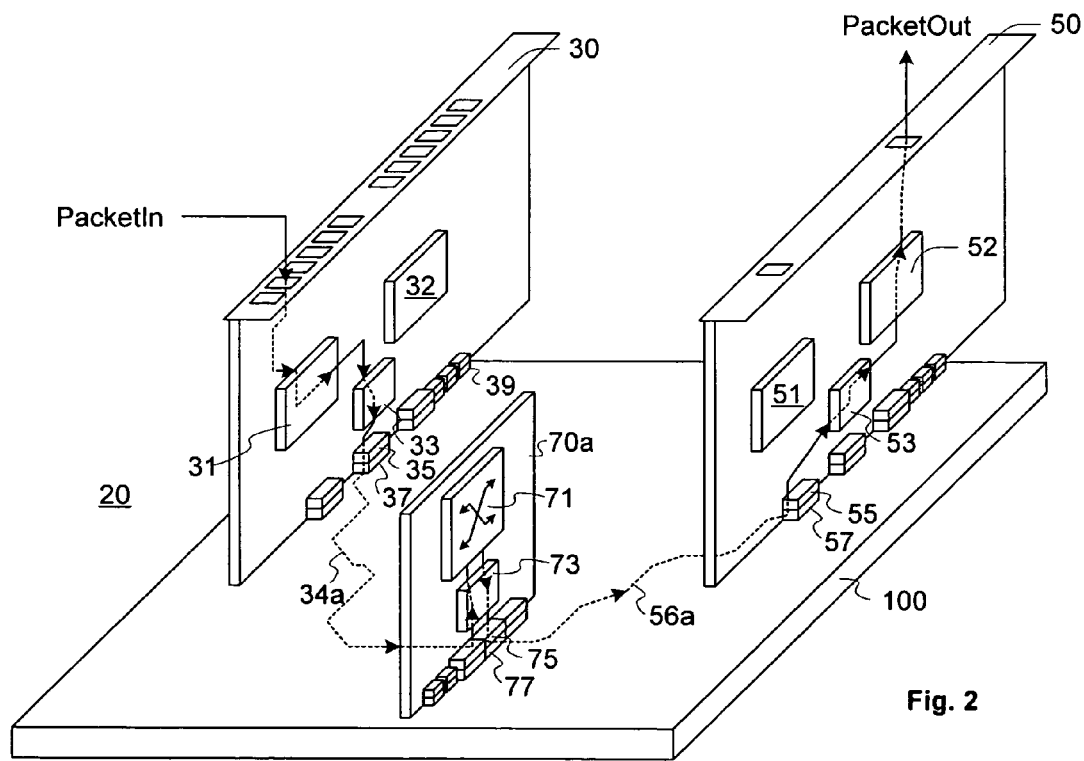
FIG. 2 illustrates one possible path for traffic entering a router at one line card and exiting the router at another line card.

FIG. 2 shows an exemplary data path taken by part of a packet as it traverses router 20. FIG. 2 depicts three cards that would be inserted in a typical system—an ingress line card 30, an egress line card 50, and a switch fabric card 70a. Note that a fully functional system would usually contain at least seven additional switch fabric cards and at least one functioning RPM card, but these have been omitted from FIG. 2 for clarity.

Cards 30, 50, and 70a are shown connected to a backplane 100 using board connectors and sockets, of which the numbered connectors 35, 55, 75 and numbered sockets 37, 57, 77 are typical. The board connectors are press-fit onto their respective cards, and the matching sockets are press-fit onto the backplane. A card then can be connected to the backplane by mating the connectors with the sockets at a desired card slot. Other connectors (such as connector 39) located at each slot perform functions such as supplying power to a card.

The number of integrated circuits and division of circuitry functions on a card can be varied in many ways. In FIG. 2, line card circuitry is illustrated in one possible configuration: an ingress circuit (31 and 51) for processing packets received at the line card, an egress circuit (32 and 52) for processing packets to be transmitted by the line card, and a serdes (serializer/deserializers 33 and 53) for passing packets between the ingress/egress circuits and the switch fabric cards. Switch fabric card circuitry is illustrated in one possible configuration also: a switch 71 in communication with a serdes 73 to pass packet data between switch 71 and the line cards.

One possible data path through router 20 is shown in FIG. 2. An incoming packet PacketIn is received at a port on line card 30. Ingress circuit 31 processes the packet, determines that the appropriate router egress port is on line card 50, and queues the packet in a queue corresponding to line card 50. At an appropriate epoch, one data path of switch 71 is configured (along with the corresponding switches on the other switch fabric cards, not shown) to switch data from line card 30 to line card 50. During that epoch, serdes 33 receives the exemplary packet's data from the queue, serializes it, and transmits a portion of that data to each switch fabric card. Serdes 33 transmits the portion of that data bound for switching fabric card 70a over a physical path comprising connector 35, socket 37, differential pair 34a in backplane 100, socket 77, and connector 75. Serdes 73 receives that data, de-serializes it, and passes it to switch 71. Switch 71 switches the data to an appropriate channel for line card 50, and then passes the data back to serdes 73. Serdes 73 reserializes and transmits the data over a physical path comprising connector 75, socket 77, differential pair 56a in backplane 100, socket 55, and connector 57. Serdes 53 combines the serial data received from the switch fabric cards and passes the de-serialized data to egress circuit 52. Egress circuit 52 performs additional packet processing, and queues the packet for transmission out the appropriate egress port as PacketOut.

Backplane Embodiments from the '622 Application

FIG. 3 shows a detailed backplane-plating layout for a router 20 and backplane 100 as described in FIGS. 1 and 2.

A top panel region of backplane 100 has connector regions ("slots") for sixteen cards. The outboard seven slots on each end are each configured to accept a line card (slots LC0 to LC6 and LC7 to LC13). The middlemost two slots are each configured to accept a route-processing module (slots RPM0 and RPM1). Each slot has three upper connector regions (e.g., regions JL4U0, JL4U1, and JL4U2 for slot LC4) used to distribute power and ground signals to a card. Below these, each line card slot has three high-speed connector regions (e.g., regions JLC4A, JLC4B, and JLC4C for slot LC4). The RPM slots serve more card connections than the line card slots, and therefore use a larger high-speed connector region. In one embodiment, the high-speed connector regions are laid out to accept HS3 press-fit sockets, available from Tyco Electronics Corporation (formerly AMP Incorporated).

A bottom panel region of backplane 100 contains connector regions or slots for nine cards. Each of these slots in configured to accept a switch fabric card (slots SF0 to SF8). Each slot has two lower connector regions (e.g., regions JSF8U0 and JSF8U1 for slot LC8) used to distribute power and ground signals to a switch fabric card. Above these, each switch fabric card slot has three high-speed connector regions (e.g., regions JSF8A, JSF8B, and JSF8C for slot SF8).

The bottom panel region also contains connector regions for connecting power and ground to the backplane. Two 48-volt power distribution layers are embedded in backplane 100, an "A" power distribution layer and a "B" power distribution layer. At the lower left of backplane 100, two large multi-thru-hole regions 48VA and 48VA RTN allow for connection of "A" power supply and return leads to one power supply, and a third large region CGND allows for connection of a common ground. Similar connections for a "B" power distribution layer to a second power supply exist at the lower right of backplane 100.

With reference now to FIG. 4, the material "stack" used to create backplane 100 in one embodiment is illustrated in cross-section. The material stack of FIG. 4 has 34 conductive layers L01 to L34 separated by appropriate insulating layers. For each conductive layer, FIG. 4 labels that layer with a layer thickness in mils and an identifier for the layer. Layers labeled "GND" are digital ground plane layers. Layers labeled "HSn" are the high-speed signaling layers, where n represents the layer number. Layers labeled "Signal xn" and "Signal yn" are the low-speed signaling layers. The two "A 48V" layers are the supply ("dc") and return ("rtn") for one power supply, and the two "B 48V" layers are the supply and return for the other power supply. For each insulating layer, the layer is accompanied by a description of whether the layer is a core or a b-stage layer, which lamination stage is applicable for a b-stage layer (unmarked b-stage layers are cured in lamination cycle 2), and the final thickness of the layer in mils.

To achieve high signaling speeds, the dielectric layers use a dielectric with significantly lower loss at multi-Gbps signaling rates than conventional FR4 dielectric systems. One such material is a thermosetting allylated polyphenylene ether (APPE, e.g., the "N6000-21" product family line available from Park/Nelco).

The arrangement of the conductive layers also enhances signaling speed and helps control EMI (electromagnetic interference). Each high-speed layer (with its differential signaling traces) is formed approximately equally spaced from and between two digital ground planes, e.g., high-speed layer HS1 is formed on layer L03, between ground planes at L02 and L04. Similarly, low-speed signaling layers L13 and L14 are isolated from the remaining stack by two digital grounds (L12 and L15), low-speed signaling layers L21 and L22 are isolated by two digital grounds (L20 and L23), and the four power distribution layers L15 to L19 are isolated from the remaining stack by two digital grounds (L15 and L20) at the center of the material stack. Further, the two power supply planes are placed between the two power return planes to provide yet one more layer of isolation. The result is a material stack that provides clean power distribution and good isolation for the high-speed signals.

One additional observation is that in order to provide these capabilities, the complete material stack is relatively thick compared to prior art boards, i.e., approximately 300 mils including 34 conductive layers.

Figure 5:
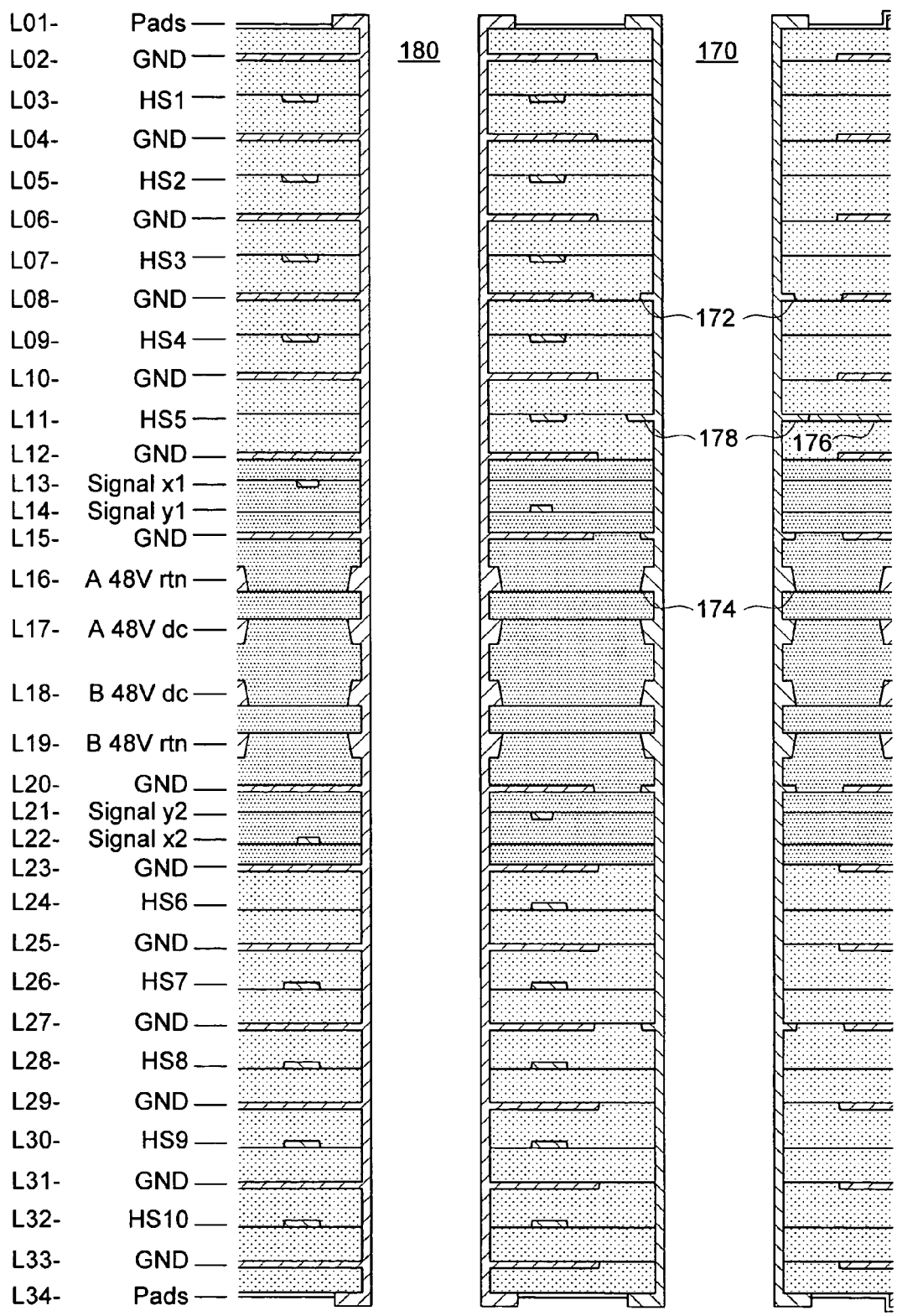
FIG. 5 illustrates a signal thru-hole and a ground hole in cross-section for the router backplane shown in FIG. 3.

FIG. 5 illustrates, in cross-section, a backplane signaling thru-hole 170 and a ground thru-hole 180 in an embodiment of the '622 application backplane. In addition to shielding and trace impedance control, the digital ground layers are used for stub impedance control at the thru-holes. Several ground plane layers (L08, L15, L20, and L27) are fitted with nonfunctional pads (e.g., pad 172) at the location of signaling thru-hole 170. These pads adjust the impedance of the stubs formed by the thru-holes, reducing reflections and thereby improving the quality of the signals passing through the backplane.

In the '622 application, several approaches are given for fabricating a backplane with such a high layer count and thick four-ounce copper embedded power planes. One approach uses FR4 dielectric sheets for the low-speed and DC layers (between digital ground layer L12 and digital ground layer L23) and a high-speed dielectric such as N6000 for the outer layers. Another approach uses, e.g., N6000 for all dielectric layers, but creates two sub-assemblies, comprising layers L16 and L17 and layers L18 and L19 with surrounding glass sheets. The two sub-assemblies are then integrated with the remaining layers during a final curing step.

Backplane Embodiments for the Present Invention

Figure 6:
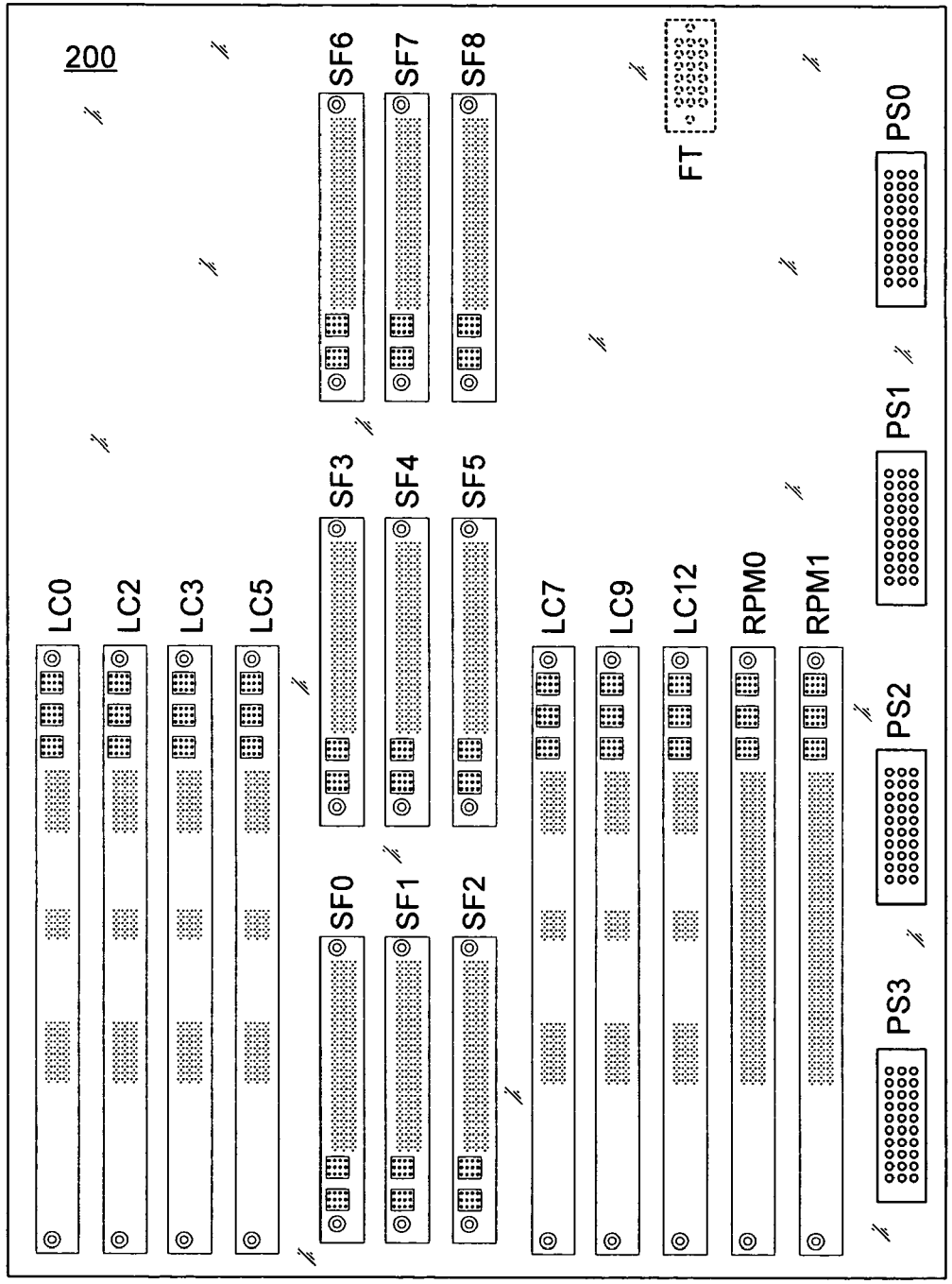
FIG. 6 shows the external layout for a router backplane circuit board according to an embodiment of the present invention.

FIG. 6 illustrates the general layout for one backplane 200 according to an embodiment of the present invention. Backplane 200 accepts the same line, switch fabric, and RPM cards as backplane 100.

Nine switch fabric slots, SF0 through SF8, are arranged in three rows and three columns near the center of backplane 200. Although other arrangements are possible, this arrangement is attractive for several reasons. First, it reduces longest differential pair trace lengths over the design used in backplane 100. Second, it allows a reduction in the number of differential pairs that must be routed through the connector blocks of the switch fabric cards, since in general those line cards that connect to the left side of the switch fabric card connector regions are positioned to the left of all switch fabric cards, and vice versa for the line cards that connect to the right side of the switch fabric card connector regions. Third, since in this embodiment the switch fabric cards are roughly one-third the height of the line cards, this arrangement efficiently utilizes the full height required for the line cards. Finally, the stacked arrangement allows for efficient cooling airflow to all switch fabric cards.

Four line card slots are positioned to the left of the switch fabric slots on backplane 200, and three line card slots are positioned to the right of the switch fabric slots. It is noted that the line card slots are not numbered consecutively, but according to the switch fabric port that serves those cards. Since the switch fabric card slots are pin-compatible with the card slots of FIG. 3, which supports twice as many line cards, not all switch fabric ports are needed in this embodiment. Those line card slots to the left of the switch fabric card slots are numbered LC0, LC2, LC3, and LC5. Thus switch fabric ports LC1 and LC4 are skipped, making more routing room available in the congested areas around the switch fabric card slots. A similar consideration results in the selection of line card slots LC7, LC9, and LC12 to populate the area to the right of the switch fabric card slots.

Two RPM card slots, RPM0 and RPM1, are positioned to the right of line card slots LC7, LC9, and LC12. These slots are kept adjacent and to one side since the RPMs communicate with each other and with the other cards at lower rates, but only use one pair of high-speed ports each.

Four power connectors PS0 to PS3 are arranged along the far right edge of backplane 200. Two power connectors connect an A power supply to two A power planes, and the other two power connectors connect a B power supply to two B power planes. This arrangement allows router power supplies to be mounted immediately to the right of the backplane, with short connections to the backplane in relative isolation from the EMI generated by the high-speed circuitry. The power connectors are placed on backplane 200 in an area largely devoid of signal traces and isolated from the high-speed cards, further improving noise isolation for the power distribution system.

Finally, a fan tray connector FT is arranged near the top of backplane 200 to provide power and control signals to cooling fans for the router. Like backplane 100, backplane 200 can employ a slot (not shown) on the power planes to help isolate electrical noise generated by the fan trays from the remainder of the power distribution paths. The location of connector FT—far away from other power connectors—further improves isolation of the cooling fan system and electronic system components.

FIG. 7 illustrates a cross-section for the material stack used to fabricate backplane 200. Compared to the material stack of FIG. 4, there are many similarities, but some significant differences. The most apparent difference is quite possibly the number of layers: FIG. 4 uses ten high-speed signaling layers, four low-speed signaling layers, and fourteen digital ground planes, while FIG. 7 uses only four high-speed signaling layers (which include all low-speed signaling as well) and six digital ground planes. Also apparent is the use of 2-ounce copper for the power planes, as opposed to the 4-ounce copper used in FIG. 4. The combination of a smaller number of layers, much thinner power planes, and the use of FR4 throughout allows for the use of standard lamination steps in fabricating backplane 200.

Backplane 200 supports the same number of switch fabric and RPM cards, and half as many line cards as backplane 100, using 70% less signaling layers. To achieve this, layer-swapping vias and a smaller differential pair configuration are used.

In backplane 100, no layer-swapping vias were used. In backplane 200, layer-swapping vias are used to reduce the number of layers required to fabricate the backplane. Even at 3.125 Gbps, however, a via can significantly distort the eye pattern transmitted by a differential pair. Thus in the present invention, vias are designed so as to reduce reflections along the signal path, as compared to standard vias, as a high-speed signal passes through them.

Figure 8:
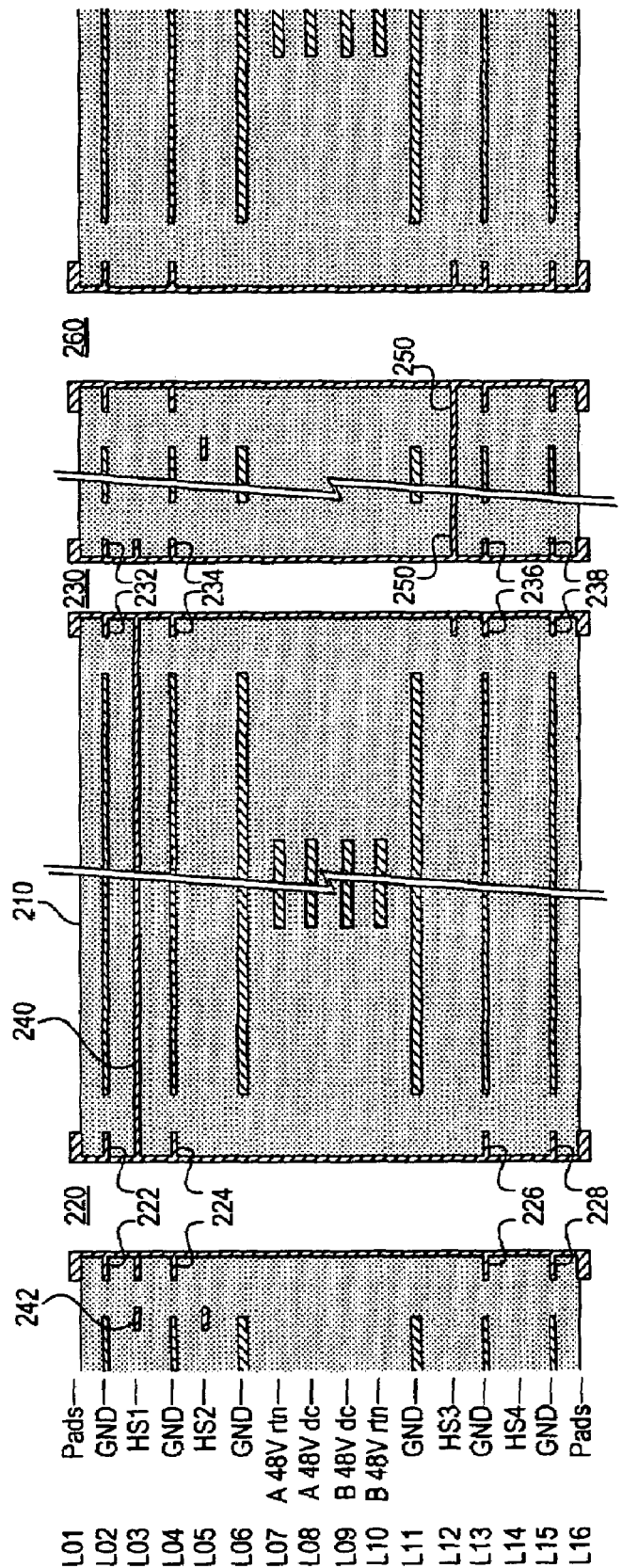
FIG. 8 shows a pair of signal thru-holes connected by a layer-swapping via in cross-section for the embodiment shown in FIG. 6.

FIG. 8 illustrates a backplane cross-section 210, taken through an exemplary pair of thru-holes 220 and 260 and a via 230 connected to those thru-holes. Thru-hole 220 has a finished (i.e., plated) opening with a 24-mil diameter. Four nonfunctional conductive pads 222, 224, 226, and 228, located respectively at digital ground layers L02, L04, L13, and L15, are aligned with thru-hole 220. Thus when thru-hole 220 is drilled through the four nonfunctional conductive pads, making the pads annular, and then plated to form a conductive lining, the annular nonfunctional pads are electrically connected to the plating lining the surface of thru-hole 220.

Nonfunctional conductive pads 222, 224, 226, 228 are each separated from their respective ground plane layers by a clearance—in this embodiment, a 10-mil clearance is selected. The nonfunctional pad diameter, clearance, and selection of which layers will include nonfunctional pads all affect the impedance characteristics of the thru-hole. The minimum pad diameter, however, may be constrained by drill accuracy. In this example, pads 222, 224, 226, and 228 have a pad diameter of 40 mils. Note that the ground planes without non-conductive pads (L06 and L11) are setback from thru-hole 220 the same distance as the other ground planes (a 60-mil opening, with roughly a 17-mil clearance), such that their capacitive coupling to thru-hole 220 is substantially less than ground planes L02, L04, L13, and L15.

Cross-section 210 shows two exemplary signal traces, trace 240 on signal layer HS1 and trace 250 on signal layer HS3. Trace 240 connects to thru-hole 220. Trace 250 connects to another thru-hole 260 similar to thru-hole 220.

Trace 240 and trace 250 transfer a signal from thru-hole 220 to thru-hole 260 because they are joined by via 230. In the '622 application, vias were avoided due to the substantial signal degradation they caused. But in the present application, with a much thinner material stack, it has been found that a small-diameter via with nonfunctional pads on selected ground planes can transfer a signal from one high-speed signal layer to another with little degradation.

Via 230 has a finished drill diameter of approximately 13.5 mils, and is drilled through four nonfunctional pads 232, 234, 236, and 238, making the pads annular. The annular nonfunctional pads are located respectively on ground plane layers L02, L04, L13, and L15 and connected to the conductive lining of via 230. Although these are the same layers containing annular nonfunctional pads in thru-hole 220, there is no requirement that the pad layers match up between thru-hole and via, or even that the thru-hole have nonfunctional pads at all. The beneficial effects of nonfunctional pads in vias can be enjoyed regardless of thru-hole configuration.

Annular nonfunctional pads 232, 234, 236, and 238 have a 26-mil outer diameter, such that each pad protrudes from its via a shorter distance (approximately five mils) than, e.g., pad 222 protrudes from its thru-hole (approximately seven mils). Generally, the smaller the hole diameter, the smaller the impedance effects that require compensation. The clearance from each nonfunctional pad to the adjacent ground plane is approximately 10 mils in this example.

Note that the power layers (L07, L08, L09, and L10) are set back from both thru-hole 220 and via 230 significantly further than the digital ground planes and signal traces (e.g., trace 242). This is preferable as it decreases EMI between each power plane and the vias and thru-holes. In this embodiment, 135-mil clearances are used between power planes and vias, and 150-mil clearances are used between power planes and thru-holes. More generally, a power-plane clearance at least three times the digital ground plane clearance can be used.

Differential Pair Configuration

High-speed signaling across backplane 200 preferably utilizes differential trace pairs. One aspect of the present invention therefore involves the routing layout of differential trace pairs within the high-speed signaling layers and thru vias such as via 230.

With the approximately 7-mil spacing between each signaling trace and its adjacent digital ground planes, certain trace pitches are preferable as they allow a desired relationship (approximately equal, or marginally more differential than single-ended) between single-ended and differential trace impedance. For instance, one preferred geometry (shown in FIG. 9) uses 6-mil traces on 14-mil spacing, and achieves a differential impedance of about 98 ohms.

FIG. 9 shows a partial routing layout 300 for a segment of backplane 200. This particular segment contains vias for ten pairs of layer-swapped differential pairs. In layout 300, all ten differential pairs are swapped from HS1 to either HS3 or HS4. Power plane configuration in this backplane segment is shown as well to illustrate the significantly larger clearance (e.g., clearance 330) afforded the vias on a power plane layer.

This section is instructional as it illustrates several arrangements used to run differential pairs into and out of a pair of differential vias. A 14-mil trace spacing cannot be maintained at the vias, as the signal pads and nonfunctional pads each have a 26-mil diameter. Accordingly, a somewhat larger spacing must exist at the vias. As shown for vias 302 and 304, the via pair is separated such that their individual clearances 314 and 316 just meet, i.e., a 46-mil center-to-center via spacing in this example.

Several differential pair via approach paths are shown as well. Differential pair 310, 312 approaches vias 302, 304 such that trace 310 runs substantially straight in to via 302. Trace 312 parallels trace 310 to a point at which it must veer off at a 45-degree angle to run substantially straight in to via 304. Differential pair 340, 342 illustrates a rotated via pair arrangement that allows both traces to run straight in to their respective vias. And differential pair 350, 352 illustrates yet another arrangement wherein the centerline of the pair runs substantially straight at the midpoint between two vias, with each trace turning 45 degrees towards its respective via, at an appropriate point, to run into that via.

Board Fabrication

Referring back to FIG. 7, a process for fabricating an embodiment of the invention will now be described. Prior to assembly of the backplane, a first step in the fabrication of the backplane is the makeup of plated and patterned core sheets. For a high-speed layer, a preferred core sheet consists of two sheets of 50.2% resin content 2113 FR-4, which are laminated together under laminating conditions as recommended by the manufacturer to cure them. Once bonded and cured, these two sheets form a core dielectric layer about 7.0 mils thick.

The core is plated with one-ounce copper on both sides. The copper on one side is patterned using an etch-compensated process to produce one of the desired layers of high-speed differential pairs; the copper on the other side is patterned using a similar process to produce the adjacent digital ground plane. In one preferred embodiment, four differently patterned copper-plated cores form the four signal layers that will be assembled in the finished product.

After patterning, the patterned cores are processed through an oxide treatment process that roughens the outer surfaces of the copper plating, as well as cleans them, to enhance copper-to-b-stage adhesion during the lamination cycles. Preferably, the parameters of this process are controlled to produce a copper surface roughness similar to that found at the plating-to-core-dielectric boundary. It is believed that adjusting the top-surface and bottom-surface trace roughness to be approximately equal prevents additional mode group separation, as the current traveling along the top and bottom of the traces will incur similar delays due to surface roughness.

The three power cores are prepared in similar fashion. The primary difference is that each power core is plated with two-ounce copper on both sides. For two of the cores, a digital ground plane is patterned on one side and one of the power return planes is patterned on the opposite side. For the remaining core, the "A" power supply plane is patterned on one side and the "B" power supply plane is patterned on the opposite side.

The backplane panel is formed by stacking and aligning the copper-patterned cores from the different signal layers with cores for the power layers, in the order depicted in FIG. 7. As shown in FIG. 7, the traces of each core signaling layer face a ground plane layer on an adjacent core. A three-sheet stack of FR-4 b-stage glass is interposed between the signaling layer and the adjacent ground plane layer. The outer two sheets are 65% resin content 1080 glass, and the inner sheet is 75% resin content 106 glass. For the remaining core-to-core interfaces, two sheets of 65% resin content 1080 FR-4 glass are used.

Once the copper-patterned cores and the b-stage sheets are stacked and aligned, the material stack is placed in a booking press. The entire stack is booked under laminating conditions as recommended by the manufacturer.

After the material stack is cooled, the thru-holes and vias are drilled in the backplane, and the entire assembly is plated with one-ounce copper. The pads are then patterned, and a protective mask is added to complete the board. Connectors are then press-fit to the appropriate locations of the board to complete the backplane assembly.

Very little of the plated copper on each signaling layer is actually needed to form the signaling traces. On the other hand, each of these layers shares a core with a ground plane layer that uses a great deal of the copper originally plated on the core. Because of this disparity in copper coverage, it has been found that the patterned cores tend to curl, making them difficult to work with. Further, it has been found that during the booking process, the signaling traces tended to migrate slightly towards the edges of the board, resulting in misalignment in the final panel.

To combat these problems, the preferred embodiments use "thieving" in the signaling layer masks. In the present disclosure, thieving consists of a pattern of unconnected copper mesas in areas of the board that are trace-free and via-free. A thieving-free buffer area, generally about 200 mils wide, is maintained between thieved areas and signal traces. Thieving also helps in maintaining a consistent dielectric thickness across the board, which provides a benefit of better impedance uniformity.

One of ordinary skill in the art will recognize that the concepts taught herein can be tailored to a particular application in many other advantageous ways. Although a backplane embodiment has been disclosed, the concepts taught herein apply equally to other interconnection arrangements such as midplanes.

Although the specification may refer to "an", "one", "another", or "some" embodiment(s) in several locations, this does not necessarily mean that each such reference is to the same embodiment(s), or that the feature only applies to a single embodiment.

What is claimed is:

1. A circuit board having multiple conductive layers separated by insulating layers, the circuit board comprising:
   at least two high-speed signal layers, each comprising multiple signal traces;
   a plurality of ground plane layers, each signal layer interposed between two of the ground plane layers;
   a conductively lined via connecting a first trace on one signal layer to a second trace on another signal layer, the via passing through a set of the ground plane layers, the set comprising at least two ground plane layers; and
   annular nonfunctional conductive pads on a first selected proper subset of the set of ground plane layers, the annular nonfunctional conductive pads arranged such that the outer surface of the conductively lined via is in electrical contact with the inner surface of each annular nonfunctional conductive pad, each annular nonfunctional conductive pad isolated from the remainder of its corresponding ground plane layer by a clearance.

2. The circuit board of claim 1, wherein the set of ground plane layers comprises at least five ground plane layers, and wherein the first selected proper subset of ground plane layers consist of the two ground plane layers closest to the top surface of the circuit board and the two ground plane layers closest to the bottom surface of the circuit board.

3. The circuit board of claim 1, the first trace terminating at a first thru-hole, the second trace terminating at a second thru-hole, each thru-hole having a conductive liner passing through annular nonfunctional conductive pads on a second selected proper subset of the ground plane layers such that the conductive liners of the first and second thru-holes are in electrical contact with the inner surface of each annular nonfunctional conductive pad that the thru-holes respectively pass through, each annular nonfunctional conductive pad isolated from the remainder of its corresponding ground plane layer by a clearance.

4. The circuit board of claim 3, wherein the ground plane layers selected for annular nonfunctional conductive pads are the same layers for both the via and the first and second thru-holes.

5. The circuit board of claim 3, the via having a smaller diameter than the first and second thru-holes.

6. The circuit board of claim 3, further comprising a third trace on the same signal layer as the first trace, a fourth trace on the same signal layer as the second trace, a second conductively lined via with annular nonfunctional conductive pads, similar to the first via, connecting the third and fourth traces, the first and third traces arranged as a first differential pair, the second and fourth traces arranged as a second differential pair.

7. The circuit board of claim 6, the first and second differential pairs having a 6-mil trace width on a 14-mil spacing, and an approximately 7-mil separation from their adjacent ground plane layers.

8. The circuit board of claim 6, the first and second conductively lined vias arranged substantially adjacent with a spacing that allows the differential pairs to remain in a differential configuration substantially up to the first via, the spacing allowing the clearance of the first via and the clearance of the second via to remain substantially separate.

9. The circuit board of claim 6, wherein the insulating layers are formed of an FR4 dielectric material, the differential pairs supporting a maximum signaling speed in excess of 3 Gigabits per second.

10. The circuit board of claim 6, further comprising multiple power plane layers embedded in the circuit board, the power plane layers isolated from the high-speed signal layers by at least two of the ground plane layers.

11. The circuit board of claim 10, wherein the vias pass through the power plane layers in a power plane clearance at least three times the clearance between a via annular nonfunctional conductive pad and its corresponding ground plane layer.

12. The circuit board of claim 5, wherein the annular nonfunctional conductive pads associated with the via protrude from the via a shorter distance than the annular nonfunctional conductive pads associated with the thru-holes protrude from the thru-holes.

13. The circuit board of claim 12, wherein the annular nonfunctional conductive pads associated with the via and with the thru-holes have approximately the same clearance.

14. A circuit board having multiple conductive layers separated by insulating layers, the circuit board comprising:
   at least two high-speed signal layers, each comprising multiple signal traces;
   a plurality of ground plane layers, each signal layer interposed between two of the ground plane layers;
   a conductive via connecting a first trace on one signal layer to a second trace on another signal layer, the via passing through a set of the ground plane layers, the set comprising at least two ground plane layers; and
   annular nonfunctional conductive pads on a first selected subset of the set of ground plane layers, the annular nonfunctional conductive pads arranged such that the outer surface of the conductive via is in electrical contact with the inner surface of each annular nonfunctional conductive pad, each annular nonfunctional conductive pad isolated from the remainder of its corresponding ground plane layer by a clearance, wherein at least one of the first selected subset of ground plane layers is located closer to one end of the via than either the signal layer containing the first trace or the signal layer containing the second trace.

* * * * *